US006224394B1

(12) United States Patent
Matsumoto

(10) Patent No.: US 6,224,394 B1
(45) Date of Patent: May 1, 2001

(54) TUBULAR CIRCUIT CONNECTOR

(75) Inventor: Shuzo Matsumoto, Matsumoto (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 0 days.

(21) Appl. No.: 09/599,437

(22) Filed: Jun. 22, 2000

(30) Foreign Application Priority Data

| | | | |
|---|---|---|---|
| Jul. 2, 1999 | (JP) | .................................... | 11-189392 |
| Jul. 6, 1999 | (JP) | .................................... | 11-192056 |
| Aug. 11, 1999 | (JP) | .................................... | 11-227931 |

(51) Int. Cl.[7] .............................. H01R 12/00; H05K 1/00
(52) U.S. Cl. .............................................. 439/66
(58) Field of Search ................................ 439/66, 91, 591

(56) References Cited

U.S. PATENT DOCUMENTS 5,540,594 * 7/1996 Collins et al. ......................... 439/66

* cited by examiner

*Primary Examiner*—Tulsidas Patel
*Assistant Examiner*—Javaid Nasri
(74) *Attorney, Agent, or Firm*—Dougherty & Troxell

(57) ABSTRACT

Disclosed is a rubber-based tubular circuit connector used for electric connection between two oppositely facing sets of electrode terminals in assemblage of electronic instruments. The tubular connector comprises an elongated core tube of an insulating rubber such as a silicone rubber and a multiplicity of ring-formed cladding layers thereon arranged at a regular pitch to provide the contacting surface. Each of the ring-formed cladding layers has a bilayered structure consisting of a coating layer of a synthetic resin formed on the core tube and contacting layer of gold formed on the coating layers of the synthetic resin. The rubber-based tubular connector is prepared by (a) forming a uniform coating layer of a synthetic resin on a tubular body of a silicone rubber, (b) partially removing the coating layer from ringformed areas by using a laser beam to form ring grooves reaching the surface of the core tube, and (c) forming plating layers of gold on the ring-formed coating layers of the synthetic resin.

13 Claims, 4 Drawing Sheets

TUBULAR CIRCUIT CONNECTOR

BACKGROUND OF THE INVENTION

The present invention relates to a tubular circuit connector or, more particularly, to a rubber-based tubular circuit connector used for electric connection of circuits, for example, between a liquid crystal display unit and a circuit board for driving the same, between two display units or between two circuit boards as well as to a unique method for the preparation thereof.

As is well known, a variety of modern electric and electronic instruments are manufactured by assembling a plurality of working units, e.g., liquid crystal display modules, and circuit boards to provide an electric circuit for driving the working unit. The electric connection between the electrode terminals of the working units and the circuit boards is established by using an electric circuit connector, referred to simply as a connector hereinafter. While various types of connectors are known and employed in the prior art, the most widely employed connector is a rubber-based connector of which the reliability of electric contacting between electrode terminals is ensured by utilizing the elastic resilience of a rubber-made member. For example, the so-called "zebra"-type rubber-based connector is an integral elongated body having a stratified structure consisting of a lengthwise alternate stratification of a multiplicity of layers of an electrically insulating rubber and a multiplicity of layers of an electroconductive rubber, which is a composite rubber compounded with an electroconductive powder such as a conductive carbon black and silver powder, to exhibit a black-and-white striped appearance.

It is usual in the above described "zebra" connectors that the composite rubber forming the conductive layers has a relatively high volume resistivity so that the connectors of this type are not quite satisfactory for electric connection between electrode terminals where a low electric resistance is essential as in the connection of color liquid crystal display modules and monochrome liquid crystal display modules of 18 or more gradations because of the possible variation in the performance of the liquid crystal display as being affected by the contact resistance unless the contact resistant is controlled to be negligibly small. The "zebra" connectors are also not suitable for electric connection when the electric current passing each of the conductive layers is large to exceed, for example, 10 mA as in the connection of plasma display modules because of the temperature elevation due to the heat generated therein as a consequence of the high resistance.

Furthermore, the rubber layers constituting the "zebra" connectors have a relatively high rubber hardness so that reliable electric connection can hardly be obtained between the electrode terminal and the conductive layer of the connector unless the contacting pressure therebetween is unduly increased to such an extent that the circuit board for connection is under a risk of warping or distortion by the large contacting pressure which may lead to a decrease in the stability of electric connection with the connector. This problem of course can be solved by increasing the thickness of the substrate board of the circuit board to withstand the large contacting pressure. This means, howqever, can not always be employed because an increased thickness of the circuit board requires on the other hand a decrease in the thickness of the working unit such as the liquid crystal display modules, for example, in mobile telephones which must be very compact in volume and light in weight. When the electroconductive rubber forming the conductive layers of the "zebra" connector is a composite rubber compounded with silver particles, in addition, the phenomenon of electromigration of silver atoms sometimes takes place between the electrodes to cause deposition of silver metal on the electrode surface resulting in a decrease in the reliability of electric connection through the connector.

SUMMARY OF THE INVENTION

The present invention accordingly has an object to provide an improved rubber-based circuit connector free from the above described problems and disadvantages in the prior art rubber-based circuit connectors or, in particular, the "zebra" connectors and capable of electrically connecting oppositely positioned arrays of electrode terminals with relatively low resistance and with high reliability and stability.

Thus, the rubber-based circuit connector provided by the present invention is basically an integral tubular body consisting of an elongated tubular body of an electrically insulating rubber as a core tube and a multiplicity of electrically conductive ring-formed areas formed at a regular pitch on and around the core tube as arranged in the axial direction, the adjacent conductive ring-formed areas being insulated eacg from the other by intervention of a ring-formed insulating area.

In a first aspect of the invention, the inventive tubular circuit connector comprises:

(A) an elongated tubular body of an electrically insulating rubbery material as a core tube; and (B) a multiplicity of ring-formed bilayered cladding layers arranged on and around the core tube at a regular pitch along the axial direction of the core tube, the adjacent ring-formed cladding layers being separated each from the other by a ring groove therebetween having a depth to reach the surface of the core tube to ensure a non-contacting condition between the ring-formed cladding layers, in which each of the ring-formed bilayered cladding layers consists of:

a topmost layer as a contacting layer made from a highly electroconductive and oxidation-resistant metallic material such as gold; and a base layer intervening between the surface of the core tube and the contacting layer to secure the contacting layer on the core tube, which is formed from a material having compatibility with the core tube and the contacting layer such as a synthetic resin or a metal other than gold.

In a second aspect of the invention, the insulation between adjacent two of the ring-formed contacting layers of an electroconductive material, e.g., gold, is ensured by, instead of a ring groove, a ringformed coating layer of a polysilane compound.

Though optional, it is advantageous that a pair of elongated reinforcement rubber strips are adhesively bonded to the cladding layers along the radially opposite axial lines so as to improve reliability in handling.

The above described rubber-based connector according to the first aspect of the invention can be prepared, for example, by a method which comprises the steps of:

(a) forming a coating layer, on and around the whole surface of an elongated core tube (A) of an electrically insulating rubbery material, from a material for the base layers of the bilayered cladding layer, such as a synthetic resin;

(b) forming a multiplicity of ring grooves of a constant width by partially removing away the coating layer at a regular pitch in such a depth that the surface of the core tube is exposed bare leaving ring-formed base layers; and (c) forming a ring-formed plating layer of a highly electroconductive metallic material such as gold to serve as the contacting layer on the surface of the ring-formed base layer.

When the tubular body of a rubber subjected to the above described step (a) is a continuous-length rubber tube, the tubular body after step (c) is a head-to-tail continuum of a plurality of unit-length connectors so that the continuum after step (c) is divided by cutting apart into individual unit-length connectors.

DETAILED DESCRIPTION OF THE PREFERRED EMBODIMENTS

Figure 1:
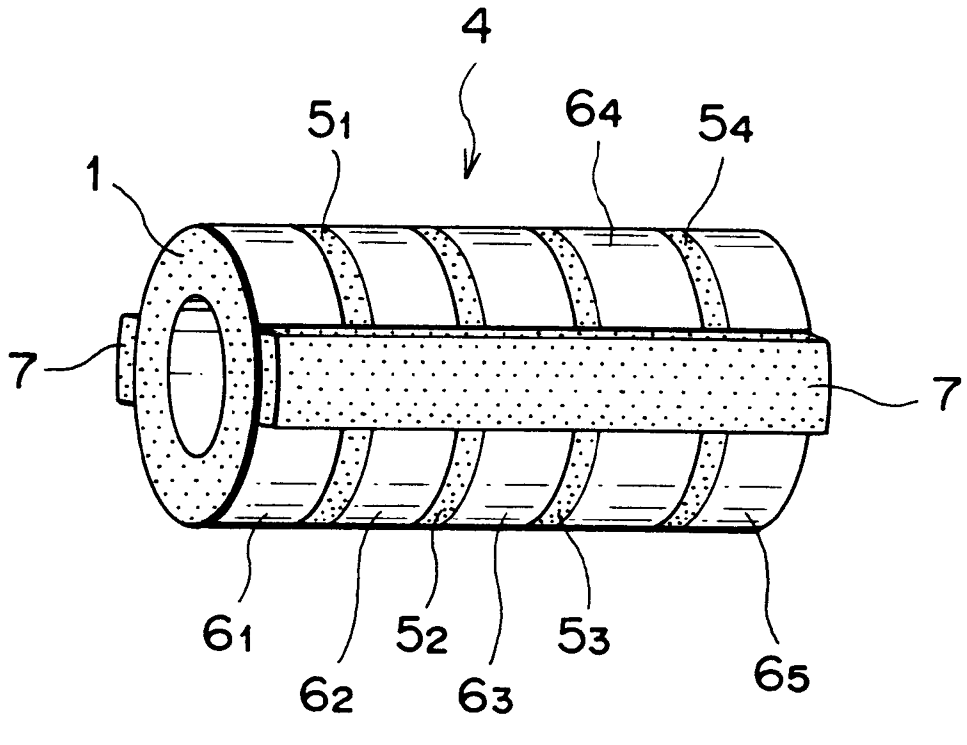
FIG. 1 is a perspective view of the inventive rubber-based tubular connector for a part with only five ring-formed cladding layers. Two reinforcement rubber strips are bonded thereto along the radially opposite axial side lines.

Firstly, a typical example of the inventive rubber-based tubular connector is illustrated by making reference to FIG. 1 of the accompanying drawing. This illustration is given for only a part of the whole connector body 4 having only five ring-formed cladding layers $\mathbf{6}_1$ to $\mathbf{6}_5$ although a single connector body 4 may comprise several tens or even more of the ring-formed cladding layers 6. As is illustrated in this figure, the rubber-based connector 4 of the invention is an integral body consisting of an elongated cylindrical tubular body 1 made from an electrically insulating rubber such as a silicone rubber to serve as the core tube 1. Five ring-formed cladding layers $\mathbf{6}_1$ to $\mathbf{6}_5$ having a constant width sometimes excepting the cladding layer $\mathbf{6}_1$ at the end of the core tube 1 are formed on and around the core tube 1 at a regular pitch. The cladding layers 6 forming each of the adjacent pairs of the ring-formed cladding layers, i.e. $\mathbf{6}_1$ and $\mathbf{6}_2$, $\mathbf{6}_2$ and $\mathbf{6}_3$, $\mathbf{6}_3$ and $\mathbf{6}_4$ and $\mathbf{6}_4$ and $\mathbf{6}_5$, are separated and electrically insulated each from the other by means of intervention of a ring groove $\mathbf{5}_1$ to $\mathbf{5}_4$, respectively, where the surface of the core tube 1 made from an insulating rubbery material is exposed bare. Namely, the ring grooves $\mathbf{5}_1$ to $\mathbf{5}_4$ have a depth to reach the surface of the core tube 1. Though not clearly shown in FIG. 1, each of the ring-formed cladding layers $\mathbf{6}_1$ to $\mathbf{6}_5$ has a bilayered structure consisting of a base layer which intervenes between the surface of the insulating core tube 1 and the topmost contacting layer formed from a highly electroconductive and highly oxidation-resistant metallic material such as gold. The material for the base layer is not particularly limitative and can be selected from resinous materials including synthetic plastic resins and metallic materials such as nickel provided that the material is compatible with both of the core tube 1 and the contacting layer and has good elastic deformability to withstand deformation of the connector body 4 caused by sandwiching between the circuit boards.

The dimensions of the core tube 1 naturally depend on the particularly intended application of the connector 4. In a typical example, the core tube 1 has an outer diameter not exceeding 6 mm and a wall thickness of from 0.5 to 3 mm or, preferably, from 0.5 to 2.5 mm. When the wall thickness of the core tube 1 is too large, the tubular connector 4 is excessively resistant against compressive deformation in the radial direction thus to decrease the reliability of the electric contacting between the metallic contacting layers of the cladding layers 6 and the electrode terminals on the circuit boards unless the contacting pressure is unduly increased. When the wall thickness is too small, the mechanical strength of the tubular connector 4 is naturally decreased and the elastic resilience to ensure reliability of electric connection is also decreased.

Examples of the rubbery material from which the core tube 1 is formed include butadiene-based synthetic rubbers such as butadienestyrene copolymeric rubbers, butadiene-acrylonitrile copolymeric rubbers and butadiene-isobutylene copolymeric rubbers, polychloroprene rubbers, vinyl chloride-vinyl acetate copolymeric rubbers, polyurethane rubbers, silicone rubbers and fluorocarbon rubbers, of which silicone rubbers are preferred in respects of their excellent properties such as heat resistance, cold resistance, anti-chemical resistance, weatherability and electric insulation as well as safety to the huma body.

The rubbery material of the core tube 1 should have a rubber hardness in the range from 30° H to 80° H or, preferably, from 40° H to 60° H according to the JIS A scale. When the rubber hardness is too high, the connector is too rigid and resistant against compressive deformation thus to decrease the reliability in the electric connection therewith while, when the rubber hardness is too low, the rubber suffers an increase in the permanent compression set leading to a decrease in the durability of the tubular connector.

Following is a description of the preparation procedure of the above described rubber-based tubular connector 4 by making reference to FIGS. 2A to 2F illustrating the manner of working on a core tube 1 in the respective steps by a perspective view of the workpiece.

Figure 2A:
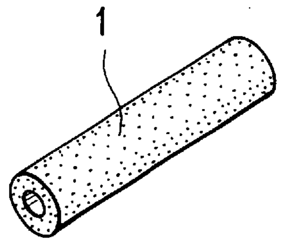
FIGS. 2A to 2F are each a schematic illustration of the steps for the preparation of the inventive rubber-based tubular connector each by a perspective view of the workpiece.
Figure 2B:
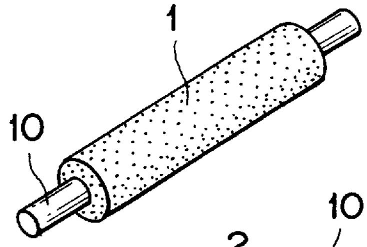

FIG. 2A is a perspective view of the cylindrical tubular body 1 of an insulating rubbery material described above as the core tube. The tubular body 1 can be a continuous-length tube or a tube of a unit length for the individual connectors. FIG. 2B is a perspective view of the same tubular body 1 into which, however, a mandrel 10 of, preferably, a metal is inserted in order to facilitate subsequent working on the surface of the tubular body 1.

Figure 2C:
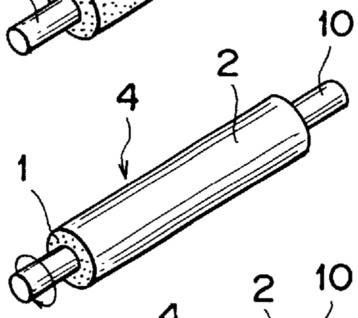

In step (a) of the inventive method, as is illustrated in FIG. 2C, a base layer 2 is formed on and around the whole surface of the tubular body 1 excepting the end surfaces of the tubular body 1. The base layer 2 to intervene between the surface of the core tube 1 and the contacting layer 3 forming the cladding layer 6 jointly with the base layer 2 can be formed either from a resinous material or from a metallic material. Examples of the resinous material suitable for forming the coating layer 2 include ABS resins, polypropylenes, polyethylenes and nylons as well as various kinds of glass fiber-reinforced plastic resins, of which ABS resins and polypropylene resins of the so-called metal-plating grade are preferred in consideration of the efficiency in the subsequent step for the formation of the contacting layer 3 by plating. The coating layer 2 is formed from these resinous materials to have a thickness in the range from 0.5 to 20 μm. When the thickness of the base layer 2 is too large, the base layer 2 is so strong and rigid that the follow-up behavior thereof to the deformation of the core tube 1 is decreased along with an eventual crack formation therein. When the thickness thereof is too small, pinholes are sometimes found in the base layer 2 of the small thickness if not to mention increased non-uniformity in the thickness thereof.

Figure 2D:
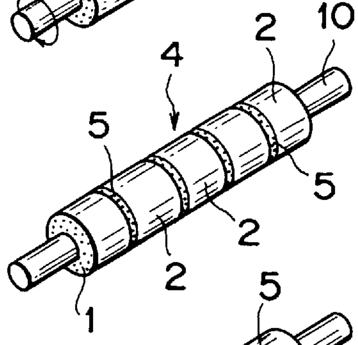

Step (b) to follow is for the formation of the ring grooves 5 arranged at a regular pitch in the axial direction of the core rube 1 as is illustrated in FIG. 2D. The ring grooves 5 can be formed by cutting or shaving off the coating layer 2 of a resinous material by using, for example, YAG laser beams in such a depth of up to 20 μm as to expose the surface of the core tube 1. Each of the ring grooves 5 has a width of, for example, about 50 μm which is large enough to ensure electric insulation between the contacting layers 3 to be formed subsequently on the respective base layers 2 jointly forming the cladding layers 6.

Figure 2E:
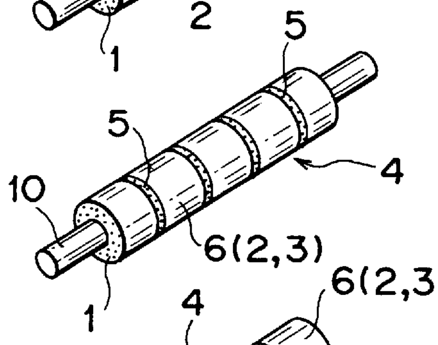

In step (c) to follow the above described step (b), a metallic plating layer 3 to serve as the contacting layer is formed, as is illustrated in FIG. 2E, on each of the ring-formed base layers 2 of a resinous material separated by the ring groove 5 formed in step (b), to form a cladding layer 6 which consists of the base layer 2 and the contacting layer 3 in a bilayered structure.

The metallic material forming the contacting layers 3 should be selected from those metals having high resistance and stability against chemicals and oxidation as well as a low volume resistivity. The most preferable metallic material in these regards is gold. The metal plating layers 3 as the contacting layer on the base layer 2 should have a thickness in the range from 0.01 to 50 μm. When the thickness is too large, the plating layer 3 is so rigid that the layer 3 is subject to eventual occurrence of fissures due to the poor behavior to follow up elastic deformation of the core tube 1 under compression between two circuit boards. When the thickness of the metal plating layers 3 is too small, pinholes are sometimes found in the plating layer 3 in addition to a possible non-uniformity of the thickness of the layers.

Figure 2F:
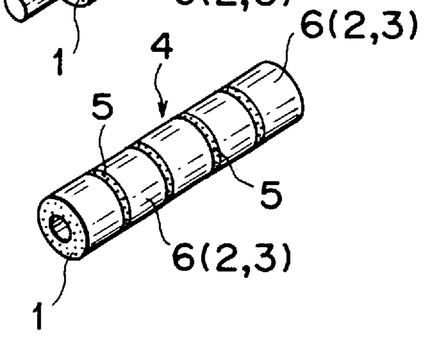
Figure 3A:
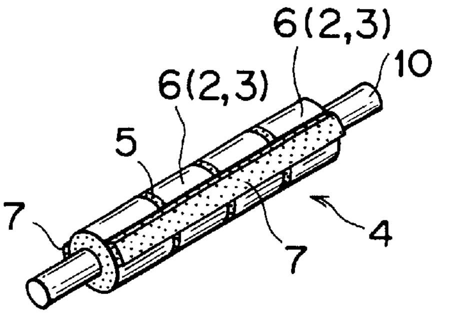
FIGS. 3A and 3B are each a schematic illustration of the steps for the preparation of the inventive rubber-based tubular connector provided with a pair of reinforcement rubber strips each by a perspective view of the workpiece.
Figure 3B:
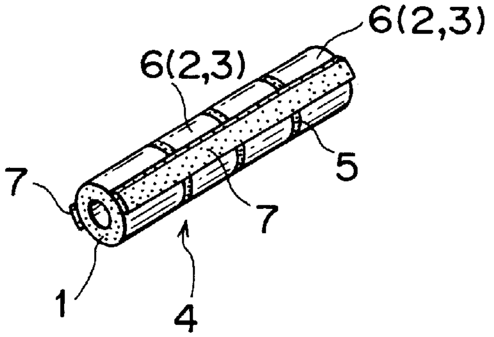

The tubular body 4 thus worked in step (c) illustrated in FIG. 2E can now serve as a connector when the mandrel 10 is removed therefrom as is illustrated in FIG. 2F. It is, however, advantageous that the tubular body 4, which is still on the mandrel 10, is provided with two reinforcement rubber strips 7,7 adhesively bonded, as is illustrated in FIG. 3A, along the radially opposite side lines running in the axial direction with an object to facilitate handling of the tubular connector and to increase reliability in setting between two arrays of electrode terminals. The mandrel 10 is removed thereafter as is illustrated in FIG. 3B.

The reinforcement rubber strips 7,7 are prepared by forming a layer of a high-hardness rubber on a low-shrinkage thin base film of a plastic resin in a method of, for example, topping or sheeting. The base film can be selected from the films of a polyester resin such as polyethylene terephthalate, polybutylene terephthalate and polyethylene nitrile and a polyimide resin. The high-hardness rubber is selected from polychloroprene rubbers, silicone rubbers, polyisoprene rubbers, butyl rubbers, fluorocarbon rubbers and urethane rubbers, of which silicone rubbers are preferred in respect of their excellent weatherability to withstand adverse environmental conditions and high mechanical properties.

The rubbery material for the reinforcement rubber strips 7,7 should have a rubber hardness in the range from 60° H to 90° H or, preferably, from 70° H to 80° H according to the JIS A scale. A rubber of too high hardness has an effect of increasing the compressive load on the connector while a rubber hardness too low results in appearance of stickiness and decrease in slipperiness leading to a decreased working efficiency of assemblage. Though dependent on the size of the tubular connector 4, the reinforcement rubber strips 7,7 have a thickness in the range from 50 to 500 μm or, preferably, from 80 to 150 μm in view of the bulkiness of the connector after bonding of the reinforcement rubber strips 7,7 on both sides.

Following is a more detailed description of the procedure for the preparation of the inventive tubular connector.

In the first place, an electrically insulating rubber compound plasticized by milling on a mixing roller is extrusion-molded by using an extruder machine into a tubular form which is vulcanized by heating at a specified temperature for a specified length of time to give a tubular body 1 of the cured rubber illustrated in FIG. 2A, which can be a continuous-length tube or, if necessary, can be divided into individual unit-length tubes by cutting. After insertion of a mandrel 10 of a metal into the bore of the cured rubber tube 1 to serve as the shaft for revolution of the tubular body 1 as is illustrated in FIG. 2B, the tubular body 1 is mounted on a screen printing machine and coated under rotation and under movement in the axial direction with a plastic resin-based coating composition to form a uniform coating layer 2 of a plastic resin as is illustrated in FIG. 2C.

Thereafter, the tubular body 1 as the core tube having a uniform coating layer 2 on the outer surface is subjected to a step of working, as is illustrated in FIG. 2D, to divide the base layer 2 into a plurality of ring-formed base layers 2 separated by ring grooves 5 arranged in the axial direction at a regular pitch by removing the coating layer in complete ring areas leaving the base layer 2 using a suitable tool such as a YAG laser cutter (not shown in the figures). It is essential that the depth of removal of the coating layer 2 is such that the surface of the core tube 1 is exposed bare by adequately controlling the working conditions of the YAG laser cutter including, for example, a power output in the range from 1 to 600 watts or, preferably, from 300 to 600 watts, irradiation time in the range from 0.05 to 3.0 seconds per single ring groove 5 and laser beam diameter in the range from 20 to 50 μm.

When the laser output is too small, good working efficiency cannot be obtained as a matter of course while, when the laser output is too large, the density of energy dose received by the surface of the core tube 1 of the cured rubber is very great eventually resulting in degradation and denaturation of the rubber.

When the irradiation time by the laser beam per cycle for a single ring groove 5 is too short, removal of the coating layer 2 thereby cannot be complete while, when the irradiation time is too long, degradation or denaturation of the cured rubber of the core tube 1 is unavoidable resulting in the loss of elastic resilience.

When the laser beam diameter is too large, the width of each of the ring grooves 5 is correspondingly increased so that the width of the contacting layer 3 to be formed on the base layer 2 is correspondingly decreased assuming the pitch being the same. When the laser beam diameter is too small, a ring groove 5 having a desired width cannot be formed by a single-turn irradiation with the laser beam necessitating irradiation of several revolutions of the tubular body 1 to decrease the working efficiency.

Lastly, an electroconductive plating layer 3 of a metal as a contacting layer is formed on each of the ring-formed base layers 2 to complete the cladding layers 6 each consisting of the base layer 2 and the contacting layer 3. The plating metal for the contacting layers 3 is preferably gold in respect of the high electroconductivity as a metal and outstandingly high stability to be capable of withstanding oxidation in the atmospheric air and attack by various chemicals. The tubular body 4 thus provided with a plurality of ring-formed cladding layers 6 is still supported by the mandrel 10 as is illustrated in FIG. 2E. The mandrel 10 is then removed from the tubular body 4 to complete the tubular connector of the invention illustrated in FIG. 2F.

Though optional as is mentioned before, it is advantageous that, with an object to facilitate handling of the tubular connector, the tubular body 4 having a plurality of the ring-formed cladding layers 6 separated by the ring grooves 5, which is still supported by the mandrel 10 as is illustrated in FIG. 2E, is provided with a pair of reinforcement rubber strips 7,7 adhesively bonded onto the surface of the tubular body 4 along the radially opposite side lines running in the axial direction of the tubular body 4 as is illustrated in FIG. 3A from which the mandrel 10 is removed to complete a reinforced tubular connector of the present invention illustrated in FIG. 3B. Each of the reinforcement rubber strips 7,7 can be formed by attaching a strip of an uncured rubber composition onto the side line of the tubular body 4 followed by curing of the uncured rubber strip to be integrated with the tubular body 4.

The tubular connector 4 of the invention prepared in the above described manner serves as a large-current circuit connector of high reliability by virtue of the low volume resistivity and outstandingly high stability of gold, which is free from the phenomena of electromigration and electrolytic corrosion, forming the contacting layer 3 of the cladding layer 6 having a bilayered structure. Good and reliable electric connection can be obtained therewith between arrays of electrode terminals even under a relatively small contacting pressure by virtue of the adequate rubber hardness of the core tube 1 so that the tubular connector 4 of the present invention can be used even in a very compact and relatively fragile instrument such as mobile telephones without the trouble of distortion or warping of the circuit boards by the contacting pressure.

Figure 4:
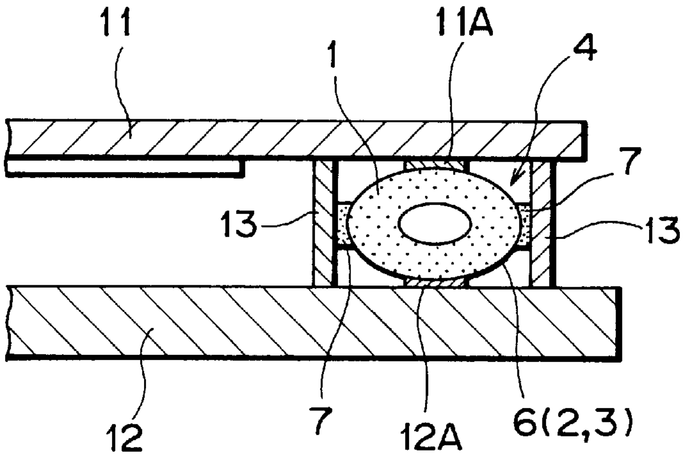
FIG. 4 is a schematic cross sectional illustration of two circuit boards assembled by using the inventive rubber-based tubular connector between arrays of electrode terminals.

FIG. 4 illustrates a tubular connector 4 of the present invention having reinforcement rubber strips 7,7 on both sides under use for electric connection between two arrays of electrode terminals 11A, 12A of the circuit boards 11, 12, respectively, by a cross sectional view. The tubular connector 4 is under a moderate compressive force in the up-to-down direction to have an elliptical cross section of a height limited by the two stays 13,13 standing between the circuit boards 11, 12 establishing reliable electric connection between the electrode terminals 11A, 12A through the contacting layer 3 of the bilayered cladding layers 6 under adequate elastic resilience of the core tube 1. Since the thickness of the contacting layer 3 of gold is so small and gold has good deformability to comply with deformation of the underlying layers, the contacting layer 3 is not under any adverse influences caused by the deformation of the core tube 1 or, as viewed from the other side, the elastic resilience of the core tube 1 is not affected by the contacting layer 3 of gold.

Further, the elliptic deformation of the tubular connector 4 under a compressive force has an effect to increase the contacting surface areas between the electrode terminals 11A,12A and the contacting layers 3 available for electric connection.

As is described above in detail, the cladding layer 6 has a bi-layered structure consisting of a base layer 2 of a synthetic resin and a contacting layer 3 of gold. It is a possible variation of this structure that the base layer 2 is formed, instead of a synthetic resin, from a plating layer of a metal or other electrically conductive materials including metals other than gold such as silver, platinum, copper, iron, cobalt, aluminum, stainless steels, titanium, zinc and the like as well as conductive metal oxides and carbides such as tin oxide, indium oxide, tungsten carbide, tantalum carbide, titanium carbide and the like provided that a good bonding strength can be obtained with the surface of the core tube 1 of a cured rubber and with the contacting layer 3 of gold formed thereon. The base layer 2 of such a material has a thickness in the range from 0.01 to 50 nm.

Excepting for the use of an electroconductive material as the material of the base layer 2 to intervene between the core tube 1 and the contacting layer 3 of gold, the tubular connector 4 of the invention can be prepared in just the same way as in the preparation of the tubular connector 4 in which the base layer 2 is formed from a synthetic resin.

According to a second aspect of the invention, of which the steps for the preparation of the tubular connector 4 are illustrated in FIGS. 5A to 5F, the core tube 1 (FIG. 5A) of an electrically insulating rubbery material is supported on a mandrel 10 and first coated with a polysilane compound to form a uniform coating layer 20 over the whole outer surface of the core tube 1. A polysilane compound is a kind of organosilicon polymers having good solubility in various organic solvents and exhibiting excellent resistance against oxygen plasma and stability. In particular, polysilane compounds are suitable for patterning by pattern-wise irradiation with ultraviolet light. Among the various types of polysilane compounds, polyphenylsilanes having a linear molecular structure are preferred in the invention. The coating layer 20 formed from a polysilane compound should have a thickness in the range from 0.1 to 20 $\mu$m as dried. When the thickness of the polysilane layer 20 is too large, the layer 20 is imparted with increased rigidity resulting in a decrease in the compatibility with deformation of the core tube 1. The layer 20 of a polysilane compound can be formed by coating the surface of the core tube 1 with a solution of the polysilane compound in an organic solvent followed by drying.

The next step to follow formation of the polysilane layer 20 over the whole outer surface of the core tube 1 (FIG. 5B) is selective ultraviolet irradiation of the polysilane layer 20 pattern-wise in the ringformed areas around the core tube 1. Since a polysilane compound can be decomposed by irradiation with ultraviolet light in an oxidizing atmosphere into silica, this step of selective irradiation of the polysilane layer 20 can be performed by irradiating the layer with ultraviolet light UV through a masking sheet 15 having a plurality of slits 15A, which may be straightly linear or wavy as in FIG. 5C, arranged at a desired pitch while the core tube 1 is rotated around the axis by means of the mandrel 10 inserted into the core tube 1 so that the polysilane compound is converted into silica forming a plurality of ringformed layers 20A of silica around the core tube 1 each between two ring-formed polysilane layers 20 (FIG. 5D).

Figure 5A:
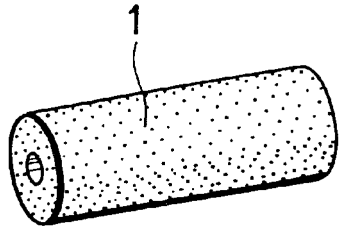
FIGS. 5A to 5F are each a schematic illustration of the steps for the preparation of the inventive rubber-based tubular connector each by a perspective view of the workpiece according to the second aspect of the invention.
Figure 5B:
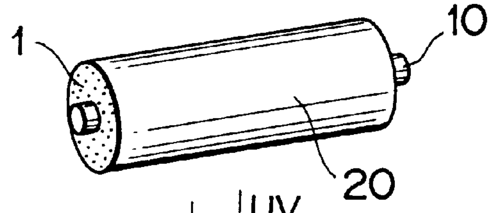
Figure 5C:
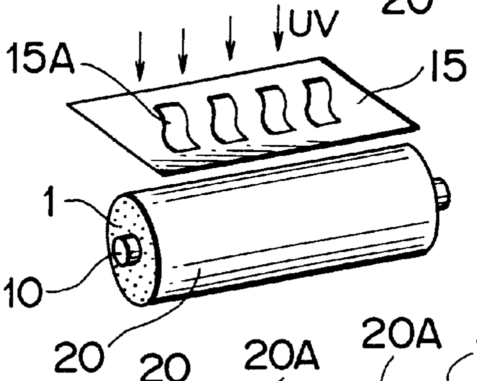
Figure 5D:
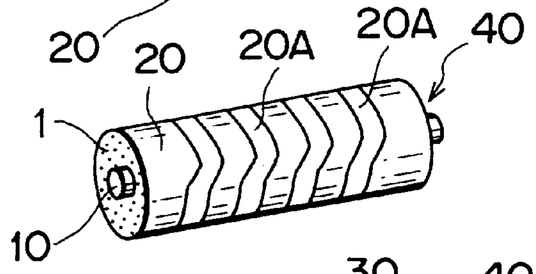
Figure 5E:
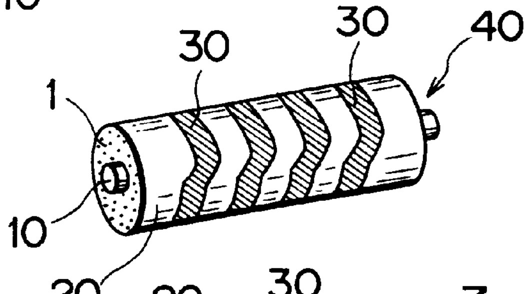
Figure 5F:
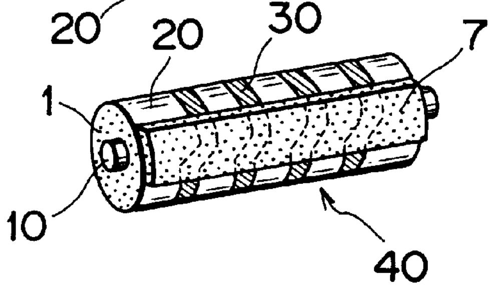

Instead of forming the contacting layers 30 of gold on the ringformed polysilane layers 20 unconverted into silica layers, the contacting layers 30 of gold can be formed on the ring-formed areas where the polysilane has been converted into silica layers 20A by a suitable method after removal of the silica (FIG. 5E).

Finally, though optional, the thus obtained tubular connector 40 is provided on one or both sides each with a reinforcement rubber strip or strips 7 adhesively bonded thereto (FIG. 5F) before removal of the mandrel 10.

In the following, the rubber-based tubular circuit connector and the method for the preparation thereof according to the present invention are described in more detail by way of Examples.

EXAMPLE 1

A silicone rubber compound (KE 151 U, a product by Shin-Etsu Chemical Co.) was kneaded and compounded with a curing agent on a mixing roller to be plasticized and the thus plasticized silicone rubber composition was extrusion-molded into a continuous-length tube having an outer diameter of 3.4 mm and an inner diameter of 2.0 mm, which was subjected to a curing treatment by heating in a hot-air oven at 195° C. for 3 minutes. The thus cured continuous-length silicone rubber tube was divided by cutting into unit-length tubes 1 each having a length of 300 mm. A stainless steel mandrel 10 having a length of 400 mm and a diameter of 2.1 mm was inserted into the bore of the 300 mm-long tubular body 1 which was mounted on a printing machine by the mandrel 10 and coated thereon with a plastic resin-containing coating composition by rotating around the axis and moving in the axial direction followed by drying to form a uniform coating layer 2 of the plastic resin having a thickness of 10 μm.

In the next place, the plastic resin layer as the base layer 2 was removed selectively in ring-formed areas by means of a YAG laser beam of 50 μm spot diameter to form ring grooves 5 each having a width of 50 μm and a depth of 20 μm at a regular pitch of 0.1 mm arranged along the axial direction of the core tube 1, where the underlying rubber layer of the core tube 1 was exposed bare. The YAG laser was operated at an output of 600 watts and the working time was 0.5 second for each of the ring grooves 5.

The plastic resin layer 2 divided into ring areas of each 50 μm width as separated with intervention of a ring groove 5 of 50 μm width were each dually plated first with nickel in a thickness of 1 μm and then with gold in a thickness of 0.5 μm to serve as the contacting layer 3.

Separately, strips of an uncured silicone rubber composition having a width of 1 mm and a thickness of 0.1 mm were prepared from the same silicone rubber compound (KE 151U, supra) and they were attached to the radially opposite side surfaces of the core tube 1 followed by a heat treatment at 185° C. for 30 minutes to effect curing of the silicone rubber composition into a cured silicone rubber having a high rubber hardness of 80° H in the JIS A scale to serve as the reinforcement rubber strips 7,7. Finally, the stainless steel mandrel 10 was removed from the tubular body 4 which was then divided by cutting along the axial direction into unit-length pieces each having a length of 10 mm to serve as a circuit connector according to the present invention.

EXAMPLE 2

A continuous-length tube of an uncured silicone rubber composition having an outer diameter of 3.0 mm and an inner diameter of 2.0 mm was prepared from a silicone rubber compound (KE 151U 100, a product by Shin-Etsu Chemical Co.) in about the same manner as in Example 1 and subjected to a curing treatment by heating in a hot-air noven at 195° C. for 3 minutes to give a continuous-length tubular body of a cured silicone rubber.

The continuous-length tube was divided into unit-length tubular bodies each having a length of 300 mm. The 300 mm-long core tube 1 supported by a 400 mm long stainless steel mandrel 10 of 2.1 mm diameter inserted into the bore of the core tube 1 was set in the vacuum chamber of a sputtering apparatus and a sputtered coating layer of conductive indium oxide having a thickness of 30 nm to serve as the base layer 2 was formed on the whole outer surface of the core tube 1 under rotation around the mandrel 10 and moving in the axial direction taking 1000 seconds.

The subsequent procedure for the preparation of the tubular circuit connectors of the invention was substantially the same as in Example 1 including the steps of formation of ring grooves 5 having the same dimensions and arranged at the same pitch as in Example 1 to serve as the base layers 2, formation of the dual plating layer of nickel and gold thereon, each plating layer having the same thickness as in Example 1, and bonding of two reinforcement rubber strips 7,7 onto the radially opposite outer surfaces of the tubular body 4 followed by dividing the same into 10 mm-long pieces.

EXAMPLE 3

A continuous-length tube of an uncured silicone rubber composition having an outer diameter of 3.4 mm and an inner diameter of 2.0 mm was prepared from the same silicone rubber compound as used in Example 1 and subjected to a curing treatment by heating in a hot-air oven at 195° C. for 3 minutes. The continuous-length cured silicone rubber tube was divided by cuffing into unit-length tubes each having a length of 300 mm.

A 400 mm long stainless steel mandrel 10 of 2.1 mm diameter was inserted into the bore of the 300 mm-long tubular body as the core tube 1 and the whole outer surface of the core tube 1 was uniformly coated with a coating composition of a polyphenylsilane having a straightly linear molecular structure followed by drying at 120° C. for 10 minutes to form a coating layer 20 of the polyphenylsilane.

The coating layer 20 of the polyphenylsilane was then irradiated with ultraviolet light of 254 nm wavelength emitted from a low-pressure mercury lamp on the ring-formed areas by rotating the core tube 1 around the mandrel 10 under a masking sheet 15 having slits 15A of 0.05 mm width at a regular pitch of 0.1 mm as is illustrated in FIG. 5C taking 10 minutes so that the polyphenylsilane in the irradiated areas was decomposed and converted into silica forming the ring-formed silica layers 20A each of which had a width of 0.05 mm in the form of a wavy ring keeping parallelism with the other ring-formed silica layers 20A.

The tubular body 1 on which a plurality of ring-formed silica layers 20A were formed in the above described manner was dipped in a solution of a noble metal salt to deposit colloidal particles of the noble metal on the silica layers 20A. Thereafter, the tubular body was subjected to an electroless plating treatment to form a plating layer of nickel having a thickness of 1 μm on the surface of the silica layers 20A bearing the colloidal particles of the noble metal. A plating layer of gold having a thickness of 0.5 μm was then formed on the nickel plating layer to serve as the contacting layer 30.

The subsequent procedure for the preparation of the inventive tubular circuit connectors of unit length was substantially the same as in Example 1 including the steps of bonding reinforcement rubber strips 7,7 onto the radially opposite side surfaces of the tubular body, removal of the stainless steel mandrel 10 from the tubular body and dividing the 300 mm-long tubular body 40 into 10 mm-long individual unit-length connector pieces.

What is claimed is:

1. A rubber-based tubular circuit connector which is an integral tubular body comprising:

(A) an elongated tubular body of an electrically insulating rubber as a core tube; and (B) a multiplicity of ring-formed cladding layers formed on and around the core tube as arranged in the axial direction of the core tube at a regular pitch, each of the ring-formed cladding layers having a bilayered structure consisting of (B1) a base layer of a synthetic resin on the surface of the core tube and (B2) a contacting layer of a metal on the base layer, and each of the ring-formed cladding layers being electrically insulated from the adjacent cladding layer with intervention of a ring groove therebetween.

2. The rubber-based tubular circuit connector as claimed in claim 1 in which the metal forming the contacting layer is gold.

3. The rubber-based tubular circuit connector as claimed in claim 1 in which the electrically insulating rubber is a silicone rubber.

4. The rubber-based tubular circuit connector as claimed in claim 1 in which the electrically insulating rubber has a rubber hardness in the range from 30° H to 80° H in the JIS A scale.

5. The rubber-based tubular circuit connector as claimed in claim 1 in which the ring groove has a depth to reach the surface of the core tube.

6. The rubber-based tubular circuit connector as claimed in claim 1 in which the synthetic resin forming the base layer is selected from the group consisting of ABS resins and polypropylene resins.

7. The rubber-based tubular circuit connector as claimed in claim 1 in which the base layer of a synthetic resin has a thickness in the range from 0.5 to 20 $\mu$m.

8. The rubber-based tubular circuit connector as claimed in claim 1 which further comprises a pair of reinforcement rubber strips adhesively bonded to the outer surface thereof along the radially oppositely facing side lines in the axial direction.

9. An electronic instrument assembled by comprising two sets of electrode terminals arranged in oppositely facing first and second arrays in which the electrode terminals of the first array and the electrode terminals of the second arrays are electrically connected with intervention of the rubber-based tubular circuit connector as defined in claim 1, therebetween under a compressive force to deform the tubular body of rubber with elastic resilience.

10. A rubber-based tubular circuit connector which is an integral tubular body comprising;

(A) an elongated tubular body of an electrically insulating rubber as a core tube; and (B) a multiplicity of ring-formed cladding layers formed on and around the core tube as arranged in the axial direction of the core tube at a regular pitch, each of the ring-formed cladding layers having a bilayered structure consisting of (B1) a base layer of nickel on the surface of the core tube and (B2) a contacting layer of gold on the base layer, and each of the ring-formed cladding layers being electrically insulated from the adjacent cladding layer with intervention of a ring groove therebetween.

11. An electronic instrument assembled by comprising two sets of electrode terminals arranged in oppositely facing first and second arrays in which the electrode terminals of the first array and the electrode terminals of the second array are electrically connected with intervention of the rubber-based tubular circuit connector as defined in claim 9 therebetween under a compressive force to deform the tubular body of rubber with elastic resilience.

12. A rubber-based tubular circuit connector which is an integral tubular body comprising;

(A) an elongated tubular body of an electrically insulating rubber as a core tube; and (B1) a multiplicity of ring-formed contacting layers of a metal formed on and around the core tube as arranged in the axial direction of the core tube at a regular pitch, each of the ring-formed contacting layers being electrically insulated from the adjacent cladding layer with intervention of (B2) a ring-formed coating layer of a polysilane compound on and around the surface of the core tube.

13. An electronic instrument assembled by comprising two sets of electrode terminals arranged in oppositely facing first and second arrays in which the electrode terminals of the first array and the electrode terminals of the second array are electrically connected with intervention of the rubber-based tubular circuit connector as defined in claim 10 therebetween under a compressive force to deform the tubular body of rubber with elastic resilience.

* * * * *